(12) United States Patent  
Nakagawa

(10) Patent No.: US 11,004,772 B2
(45) Date of Patent: May 11, 2021

(54) COOLING STRUCTURE, COOLING STRUCTURE MANUFACTURING METHOD, POWER AMPLIFIER, AND TRANSMITTER

(71) Applicant: NEC CORPORATION, Tokyo (JP)

(72) Inventor: Takahiro Nakagawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/615,441

(22) PCT Filed: Jun. 15, 2018

(86) PCT No.: PCT/JP2018/022822
§ 371 (c)(1),
(2) Date: Nov. 21, 2019

(87) PCT Pub. No.: WO2018/235726
PCT Pub. Date: Dec. 27, 2018

(65) Prior Publication Data
US 2020/0176356 A1 Jun. 4, 2020

(30) Foreign Application Priority Data

Jun. 19, 2017 (JP) .............................. JP2017-119258

(51) Int. Cl.
*H01L 23/473* (2006.01)
*H01L 21/48* (2006.01)
(Continued)

(52) U.S. Cl.
CPC ............ *H01L 23/473* (2013.01); *F28F 13/06* (2013.01); *H01L 21/4882* (2013.01); *H04B 1/036* (2013.01)

(58) Field of Classification Search
CPC .... H01L 23/473; H01L 21/4882; F28F 13/06; H04B 1/036
See application file for complete search history.

(56) References Cited

U.S. PATENT DOCUMENTS 6,031,751 A * 2/2000 Janko .................. F28F 13/00
363/144
2007/0017658 A1* 1/2007 Lehman ............. H05K 7/20254
165/80.4

FOREIGN PATENT DOCUMENTS

CN 201852443 U 6/2011
JP 55-5101 A 1/1980
(Continued)

OTHER PUBLICATIONS

International Search Report for PCT/JP2018/022822 dated, Aug. 7, 2018 (PCT/ISA/210).
(Continued)

*Primary Examiner* — Peniel M Gumedzoe

(57) ABSTRACT

A cooling structure according to the present invention is provided with: a base material formed with a cooling water flow passageway; a pipe which includes a first layer formed on an outer surface of the base material, and a second layer formed on the outside of the first layer; and a plate having the pipe cast therein. The base material is configured from a highly thermally conductive first material. The first layer is configured from a heat-resistant second material. The second layer is configured from a third material having high affinity with the second material. The plate is configured from a highly thermally conductive fourth material. The second material and the third material respectively have high affinity with the fourth material.

9 Claims, 5 Drawing Sheets

(51) Int. Cl.
*F28F 13/06* (2006.01)
*H04B 1/036* (2006.01)

(56) References Cited

FOREIGN PATENT DOCUMENTS

| | | |
|---|---|---|
| JP | S56-86669 A | 7/1981 |
| JP | 59-030465 A | 2/1984 |
| JP | 61-123459 A | 6/1986 |
| JP | 4-197569 A | 1/1992 |
| JP | 6-304739 A | 11/1994 |
| JP | H11-304314 A | 11/1999 |
| JP | 2000-340728 A | 12/2000 |
| JP | 2004-214503 A | 7/2004 |
| JP | 2006-066669 A | 3/2006 |
| JP | 2016-035945 A | 3/2016 |
| JP | 2018-124022 A | 8/2018 |

OTHER PUBLICATIONS

Written Opinion of the International Searching Authority for PCT/JP2018/022822 dated Aug. 7, 2018 (PCT/ISA/237).
Extended European Search Report dated Jun. 9, 2020 in European Application No. 18819729.7.
Japanese Office Action for JP Application No. 2019-525535 dated Feb. 2, 2021 with English Translation.

\* cited by examiner

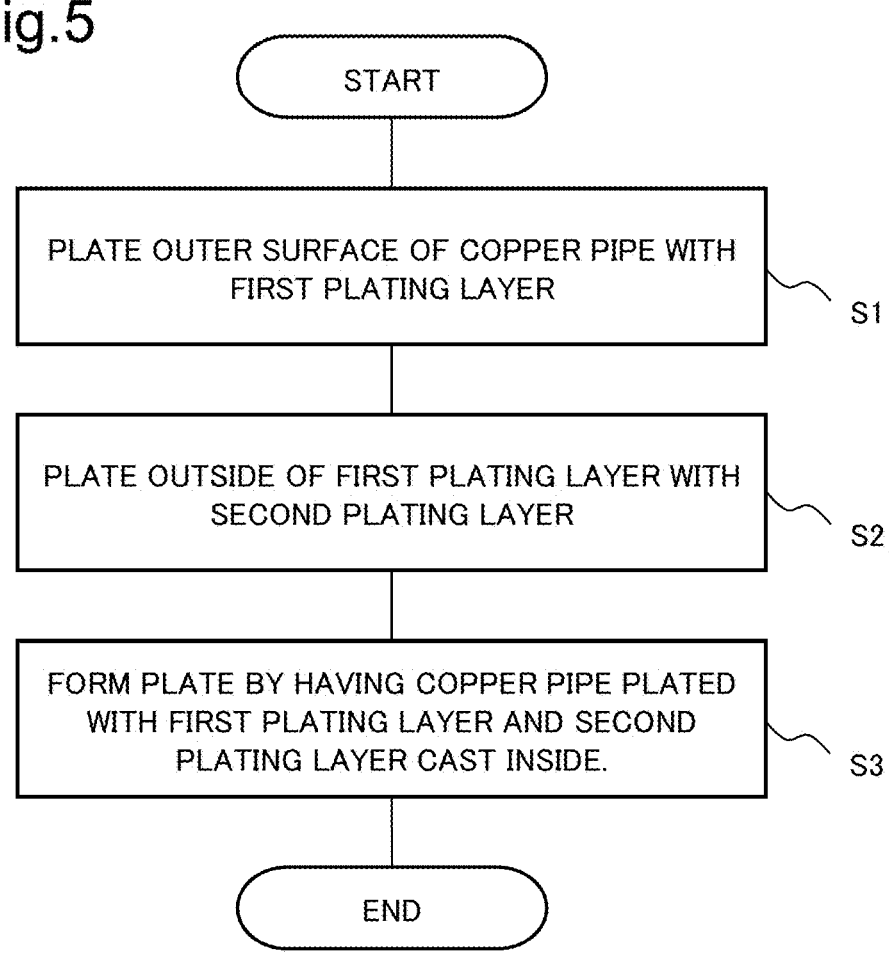

COOLING STRUCTURE, COOLING STRUCTURE MANUFACTURING METHOD, POWER AMPLIFIER, AND TRANSMITTER

CROSS REFERENCE TO RELATED APPLICATIONS

This application is a National Stage of International Application No. PCT/JP2018/022822 filed Jun. 15, 2018, claiming priority based on Japanese Patent Application No. 2017-119258, filed Jun. 19, 2017, the entire contents of which are incorporated herein.

TECHNICAL FIELD

The present disclosure relates to a cooling structure, a cooling structure manufacturing method, a power amplifier, and a transmitter.

BACKGROUND ART

A water-cooling type cooling structure is considered as a method of cooling down a heat-generating element. For example, PTL 1 describes an aluminum plate having a flat cross section as a water-cooling type cold plate, which has a corrosion resistant metal pipe cast therein. The corrosion resistant metal pipe is made of copper and copper alloy, stainless steel, or the like.

PTL 2 describes a mold for blow molding resin, which is a cast of aluminum alloy or copper. PTL 2 describes providing a mold with a passageway through which a cooling medium circulates, not by drilling, but by casting the mold having a pipe inside. The pipe inside is made of pure copper and copper alloy, or steel, throughout the inside of the mold.

PTL 3 describes a method of preventing an accident such as suspension of a broadcast system from occurring in a cooling device using coolant, even when the coolant leaks out.

CITATION LIST

Patent Literature

[PTL 1] Japanese Unexamined Patent Application Publication No. H6-304739
[PTL 2] Japanese Unexamined Patent Application Publication No. H4-197569
[PTL 4] Japanese Unexamined Patent Application Publication No. 2006-66669

SUMMARY OF INVENTION

Technical Problem

The cooling structure (cold plate) described in PTL 1 and the mold described in PTL 2 are formed by pouring a molten metal into a casting mold in which a metal pipe is provided. However, according to techniques described in PTLs 1 and 2, the larger a size of the cooling structure is, the longer it takes for a molten metal temperature in the casting mold to decrease, and thus the metal pipe is exposed to a high-temperature molten metal for a long period of time. Accordingly, when using a metal pipe having a low heat resistance, the metal pipe may be deformed or melted. Alternatively, using a stainless steel metal pipe having a high heat resistance as described in PTL 1 decreases thermal conductivity. For this reason, a cooling structure using such a metal pipe may have insufficient cooling performance toward a heat-generating element emitting intense heat, such as a heat-generating element used for the broadcast system described in PTL 3.

When a method of providing a passageway described in above-mentioned PTL 2 by drilling processing is applied to the manufacture of a cooling structure, the passageway provided in this way of manufacturing forms a linear shape reaching from one side surface to the opposite side surface of the cooling structure. Therefore, a level of freedom in a shape of a cooling water flow passageway is reduced. When a plurality of linear flow passageways are coupled together, it is necessary to provide a coupling member, which increases a size of a cooling structure.

In view of the above issue, an object of the present disclosure is to provide a cooling structure, a cooling structure manufacturing method, and a power amplifier and a transmitter each including the cooling structure, the cooling structure being capable of increasing a level of freedom in a shape of a cooling water flow passageway without increasing a size of the cooling structure, and capable of exploiting cooling performance of the cooling structure.

Solution to Problem

A cooling structure according to one aspect of the present disclosure includes: a pipe that has a base material in which a cooling water flow passageway is formed, a first layer formed on an outer surface of the base material, and a second layer formed outside the first layer; and a plate that has the pipe cast inside, wherein the base material is made of a first material being highly thermally conductive, the first layer is made of a second material having a heat resistance, the second layer is made of a third material having high affinity with the second material, the plate is made of a fourth material being highly thermally conductive, and each of the second material and the third material has high affinity with the fourth material.

A cooling structure manufacturing method according to one aspect of the present disclosure is a plate-shaped cooling structure manufacturing method and includes: forming a first layer on an outer surface of a base material, the first layer being made of a second material having a heat resistance, the base material being made of a first material being highly thermally conductive, and being pipe-shaped through which a cooling water flow passageway is formed; forming a second layer outside the first layer, the second layer being made of a third material having high affinity with the second material; and using a molten metal of a fourth material for having the base material cast inside, the fourth material being highly thermally conductive and having high affinity with the second material and the third material, the base material having the first layer and the second layer formed thereon.

A power amplifier having the above-mentioned cooling structure, and a transmitter having the power amplifier are also included within the scope of the present disclosure.

Advantageous Effects of Invention

According to the present disclosure, a cooling structure enables increase of a level of freedom in a shape of a cooling water flow passageway without increasing a size of the structure, while cooling performance of the cooling structure can be exploited.

BRIEF DESCRIPTION OF DRAWINGS

FIG. 5 is a flowchart illustrating one example of a flow of a cooling structure manufacturing method according to one example embodiment.

DESCRIPTION OF EMBODIMENTS

Figure 1:
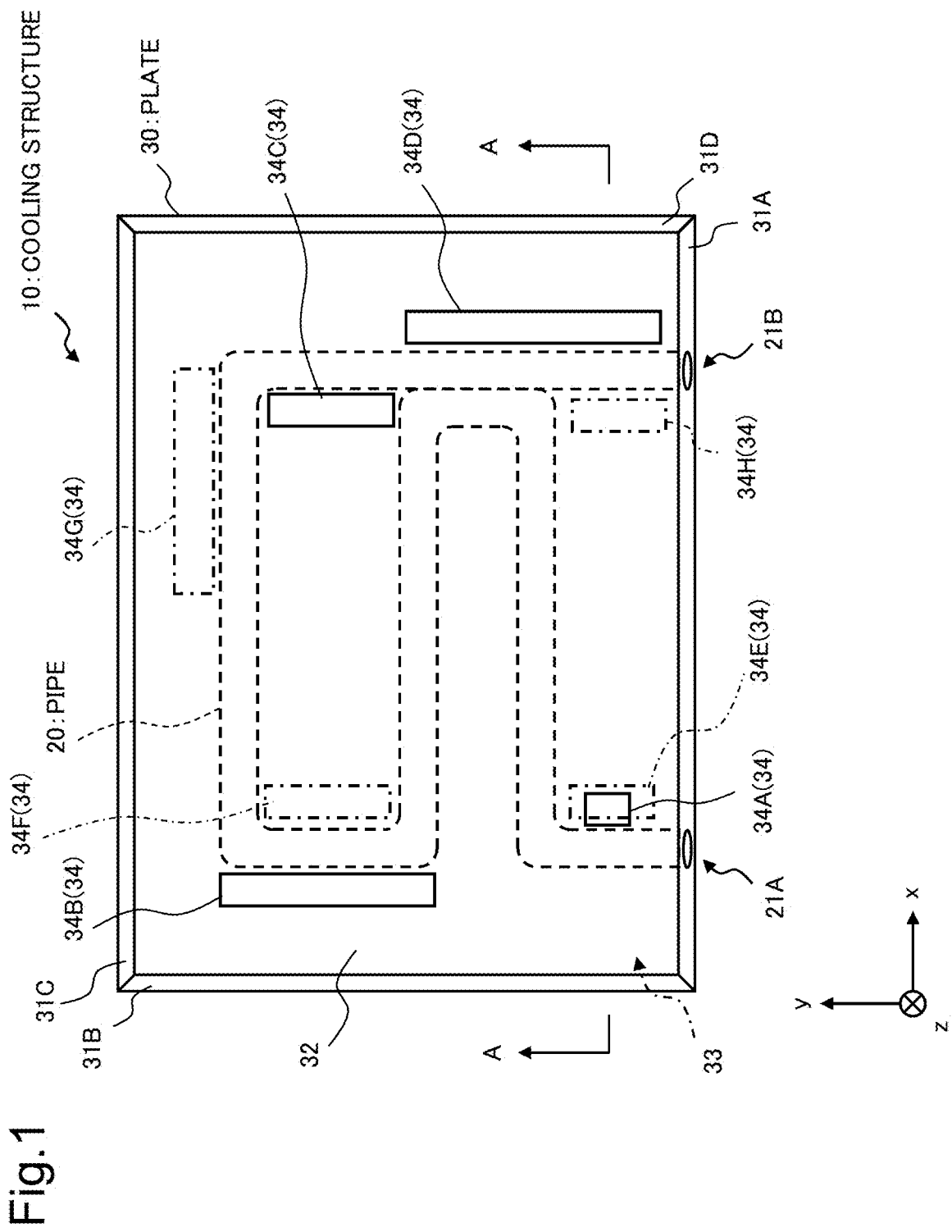
FIG. 1 is a top view illustrating one example of a cooling structure according to one example embodiment.

One example embodiment of the present disclosure will be described with reference to the drawings. FIG. 1 is a top view illustrating one example of a cooling structure 10 according to the present example embodiment. The cooling structure 10 includes a pipe 20 and a plate 30. The cooling structure 10 is formed by casting the plate 30 having the pipe 20 inside. The plate 30 is a plate-shaped structure having a predetermined thickness. The shape of the plate 30 may be a substantially rectangular shape or another shape without particular limitation. In the present example embodiment, the plate 30 is described as having a front surface and a back surface of a substantially rectangular plane shape, and having four side surfaces (31A to 31D).

Heat-generating elements (34A to 34D) are mounted on a first plane 32 of the plate 30. Heat-generating elements (34E to 34H) are mounted on a second plane 33 opposite to the first plane 32 of the plate 30. Hereinafter, the heat-generating elements (34A to 34H) are referred to as a heat-generating element 34 when not distinguishing or collectively calling these elements.

The heat-generating element 34 is an electronic component that emits heat, for example, a transistor or the like. The number of heat-generating elements 34 to be mounted on the first plane 32 and the second plane 33 may be appropriately determined without particular limitation depending on a type of equipment on which the cooling structure 10 is mounted. The position of the first plane 32 and the second plane 33 where the heat-generating element 34 is mounted may be appropriately determined without particular limitation.

The heat-generating element 34 may be mounted on one or both of the first plane 32 and the second plane 33.

The pipe 20 forms a cooling water flow passageway. Ends (21A, 21B) of the pipe 20 are provided in such a way as to be connected to a member (hose, for example) through which cooling water flows in or out from any side surface (the side surface 31A in FIG. 1) of the plate 30. The ends (21A, 21B) of the pipe 20 may be provided in such a way as to be connected to an outside of the cooling structure 10 from any side surface. Each of the ends (21A, 21B) of the pipe 20 may be provided in such a way as to be connected to an outside of the cooling structure 10 from a different side surface.

As illustrated in FIG. 1, the pipe 20 is preferably formed along the heat-generating element 34 and arranged at a position along the heat-generating element 34. The pipe 20 may be arranged in such a way as to partly or entirely overlap with each heat-generating element 34 when seen from a first plane 32 side (when seen from a negative Z axis direction). It is sufficient if the pipe 20 is arranged in a straight line shape, bent shape, or curved shape along a position corresponding to each heat-generating element 34 when seen from the first plane 32 side.

Figure 2:
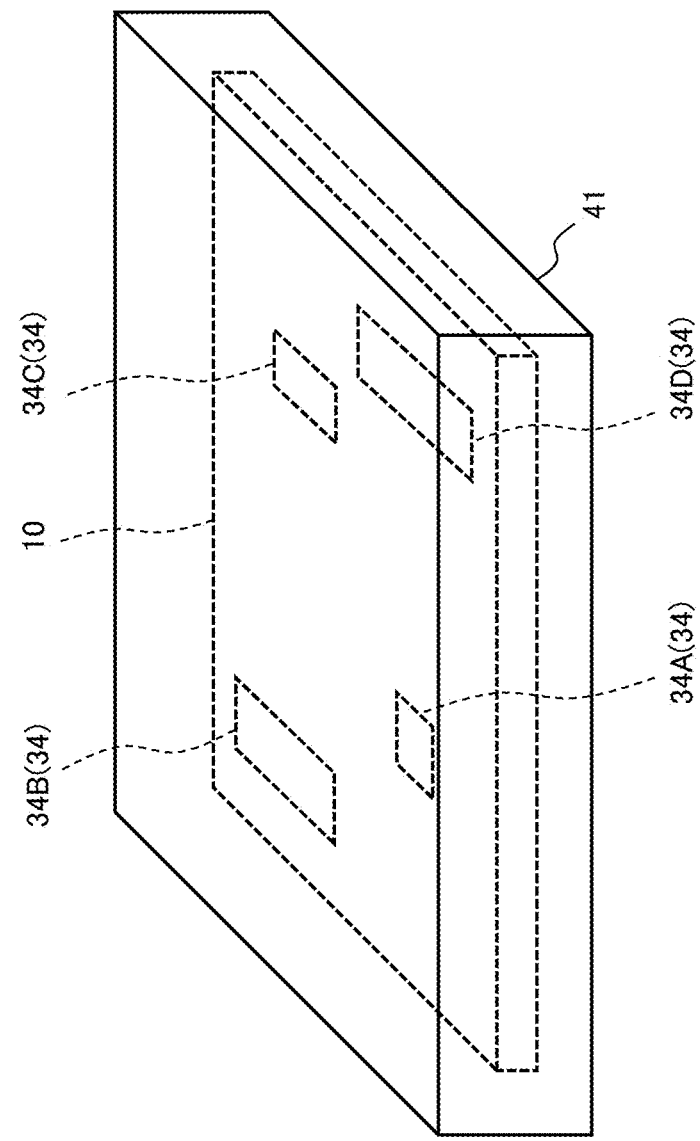
FIG. 2 is a diagram illustrating one example of a power amplifier including a cooling structure.

FIG. 2 is a diagram illustrating one example of a power amplifier 40 including the cooling structure 10. As illustrated in FIG. 2, the power amplifier 40 includes in a housing 41 the cooling structure 10 on which the heat-generating element 34 is mounted. The power amplifier 40 may also include a member other than the members illustrated in FIG. 2. For example, the power amplifier 40 may include a member for connecting a hose through which cooling water flows into the cooling structure 10 to the above-mentioned end.

Figure 3:
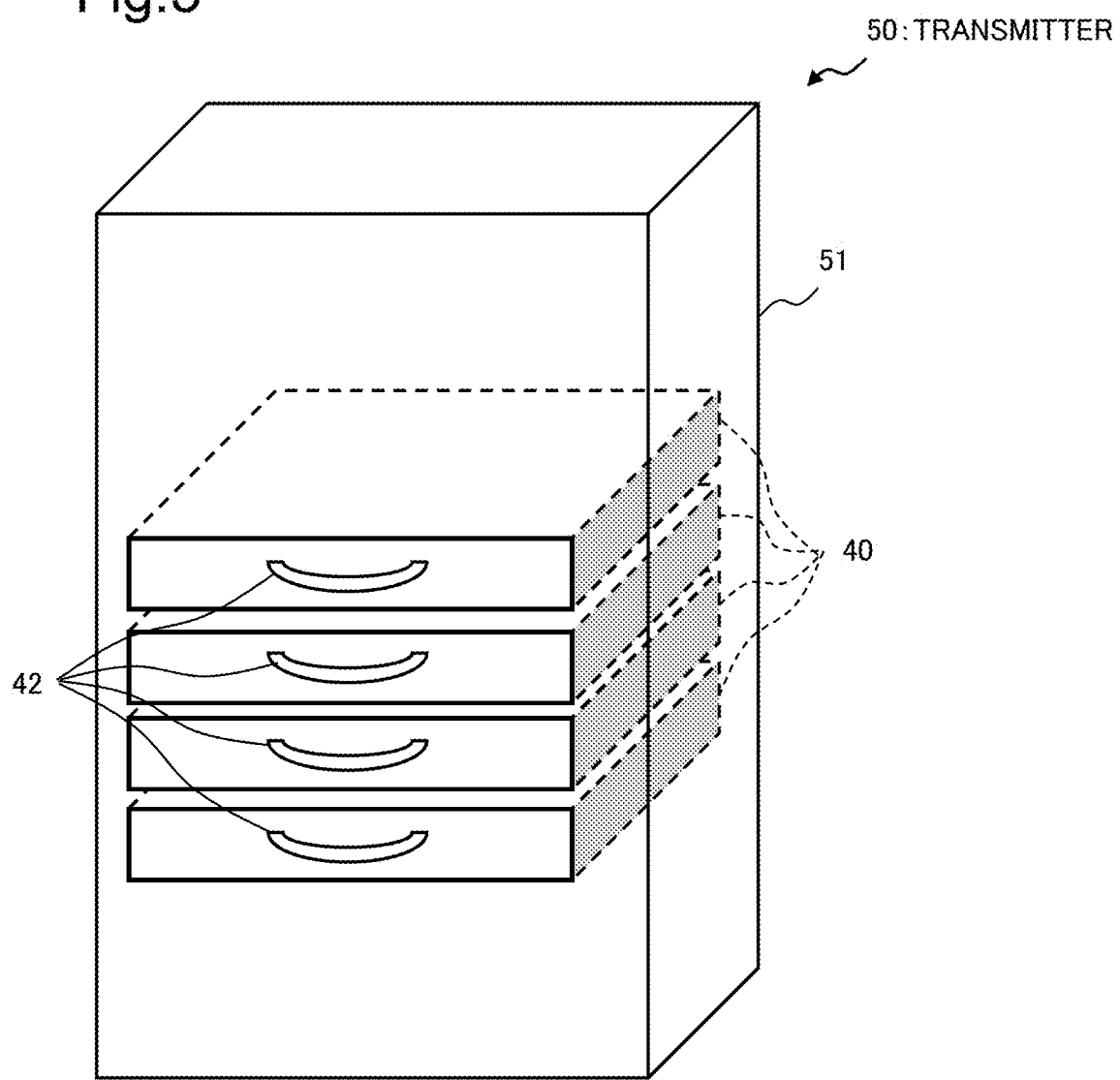
FIG. 3 is a diagram illustrating one example of a transmitter including a plurality of power amplifiers.

FIG. 3 is a diagram illustrating one example of a transmitter 50 including a plurality of power amplifiers 40. The power amplifier 40 including the cooling structure 10 according to the present example embodiment is described as amplifying a broadcast radio wave and outputting the broadcast radio wave to an antenna not illustrated. In other words, the cooling structure 10 according to the present example embodiment is applied to the transmitter 50 for sending out a broadcast radio wave.

As illustrated in FIG. 3, one or more power amplifiers 40 are stored in a rack 51. The power amplifier 40 may include a handle 42 in such a way that the power amplifier 40 can be easily stored into and taken out of the rack 51, as illustrated in FIG. 3. The number of power amplifiers 40 included in this transmitter 50 is not particularly limited, and appropriately changeable depending on a condition under which the transmitter 50 is used. Besides the power amplifier 40, the transmitter 50 includes a control unit for controlling the power amplifier 40, and another broadcast equipment. The transmitter 50 also has a mechanism through which cooling water flows into the power amplifier 40, and a mechanism through which cooling water, which have flowed through the pipe 20, flows out. Any types of mechanisms may be adopted as these mechanisms.

Figure 4:
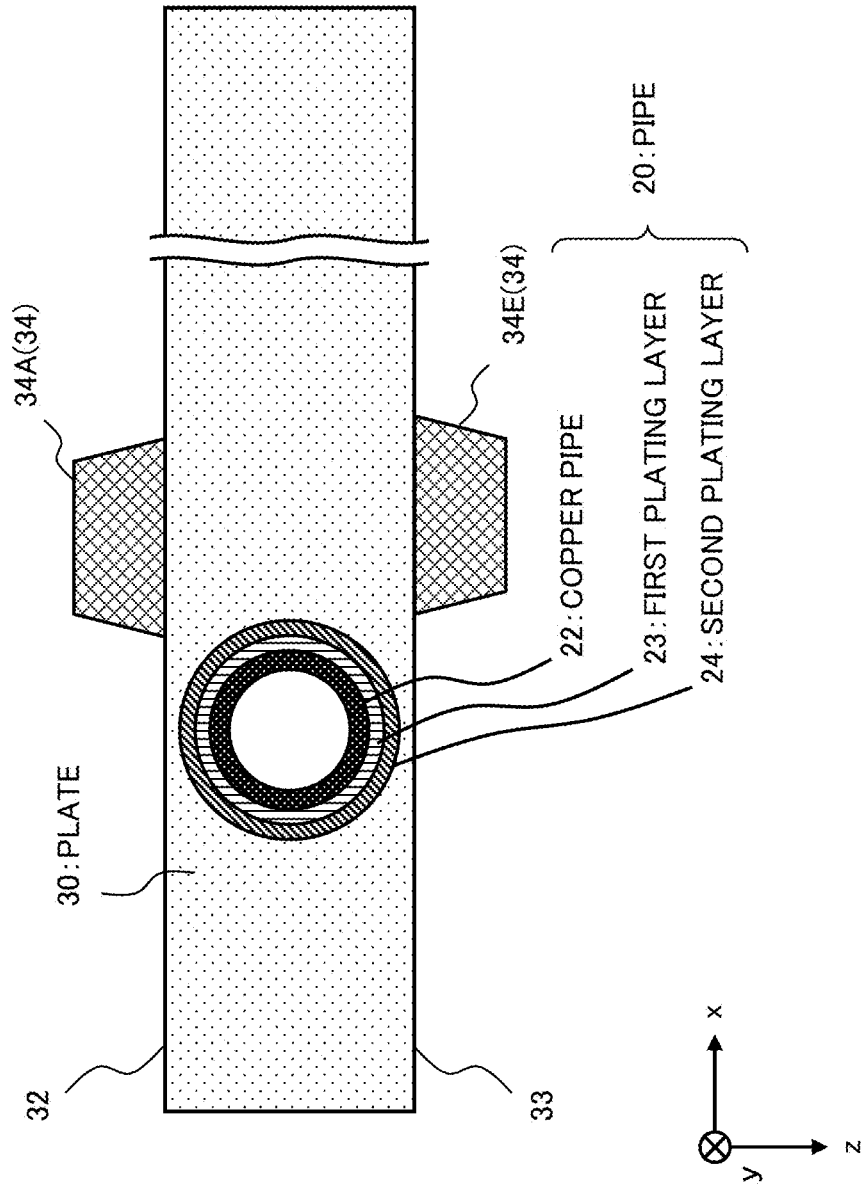
FIG. 4 is a cross-sectional enlarged view of a section A-A of FIG. 1.

Next, the cooling structure 10 will be further described next. FIG. 4 is a cross-sectional enlarged view of a section A-A of FIG. 1. As illustrated in FIG. 4, the cooling structure 10 includes the pipe 20 and the plate 30. The plate 30 is formed by being cast while having the pipe 20 inside.

The pipe 20 has a copper pipe 22 being a pipe-shaped base material, a first plating layer 23 being a first layer formed on an outer surface of the copper pipe 22, and a second plating layer 24 being a second layer formed outside the first layer.

The base material is a pipe forming a cooling water flow passageway. The base material is made of a highly thermally conductive material (first material). Being highly thermally conductive means having a thermal conductivity higher than a predetermined value. The base material being highly thermally conductive means that heat can be sufficiently conducted to cooling water to an extent in which a heat-generating element is cooled down to a desired temperature. The highly thermally conductive material includes a material having a thermal conductivity higher than that of a stainless steel, for example. A material for the base material is preferably copper. This is because the copper pipe 22 being made of copper is highly thermally conductive, highly corrosion resistant, and inexpensive, and therefore, a production cost of the cooling structure 10 can be reduced. Hence, the copper pipe 22 is described as the base material in the present example embodiment. A material for the base material may however not only be limited to copper but also alloy including copper.

The first layer is formed on the outer surface of the copper pipe 22. The first layer is made of a heat resistant material (second material) having high affinity with a material of the plate 30. Having high affinity with the material of the plate 30 means that the second material has high wettability with the plate material, and a space (mold cavity) is hardly formed in the plate at a time of casting. The first layer is preferably iron plating made of iron. This is because the iron plating being made of iron has a high heat resistance and does not melt in a high-temperature molten metal (molten metal of the material of the plate 30) at the time of casting. As a result, the copper pipe 22 may be prevented from contacting the high-temperature molten metal. Hence, the first plating layer 23 being the first layer is described as iron plating in the present example embodiment. The first layer may however not only be limited to the iron plating made of iron but also chromium plating made of chromium (Cr), nickel plating made of nickel (Ni), or another heat resistant material having high affinity with the material of the plate 30.

The second layer is formed on a front surface of the first plating layer 23. The second layer is made of a material (third material) having high affinity with the material of the first layer and the material of the plate 30. Having high affinity with the first layer means that the third material has high wettability with the first layer, and the second layer can sufficiently coat the first layer at the time of casting. Having high affinity with the material of the plate 30 means that the third material has high wettability with the plate material, and a space (mold cavity) is hardly formed in the plate at the time of casting. The material of the second layer is preferably a material at least partially melted in the molten metal used for the formation of the plate 30. The second layer is at least partially melted in the molten metal at the time of casting, whereby the first layer and the plate 30 made of materials having high affinity with each other can be coupled by placing the melted second layer therebetween. Herein, the second layer has high affinity with the first layer and the plate 30. The second layer is preferably copper plating made of copper. In this way, the copper melted in the molten metal facilitates the coupling of the first plating layer 23 and the plate 30. Hence, the second plating layer 24 being the second layer is described as copper plating in the present example embodiment. The second layer may however not only be limited to the copper plating made of copper but also silver plating made of silver (Ag), gold plating made of gold (Au), titanium plating made of titanium (Ti), or another type of plating made of different kind of metal or its alloy.

As above, the pipe 20 is preferably formed by plating the copper pipe 22 with the first plating layer 23 and the second plating layer 24 thereon. The pipe 20 is formed along the heat-generating element 34, and the plate 30 has the pipe 20 cast inside, as described above. Therefore, the pipe 20 is arranged at a position where the heat-generating element 34 can be effectively cooled down as illustrated in FIG. 4. This enables the cooling structure 10 to effectively cool down the heat-generating element 34 by the cooling water flowing through the flow passageway of the pipe 20.

Before being cast, the pipe 20 is formed in a shape along the heat-generating element 34. This shape may be formed at a timing after plating with the first plating layer 23 and the second plating layer 24, or more preferably before plating with the first plating layer 23 and the second plating layer 24. The pipe 20 is more preferably formed by plating the copper pipe 22, which is formed along the heat-generating element 34, with the first plating layer 23 and the second plating layer 24. In this way, the entire copper pipe 22 can be evenly plated with the first plating layer 23 and the second plating layer 24.

The plate 30 is cast while having the pipe 20 (the copper pipe 22 plated with the first plating layer 23 and the second plating layer 24) inside, and formed into a plate-shape with a use of a casting mold. The plate 30 is made of a highly thermally conductive material (fourth material) having high affinity with the second material and the third material.

The plate 30 is preferably made of aluminum or aluminum alloy. Because aluminum is highly thermally conductive, sufficient cooling performance of the cooling water for cooling down the heat-generating element 34 can be exploited.

Configuring the plate 30 from a highly thermally conductive material such as aluminum enables lowering the temperature of the heat-generating element 34 to a desired temperature by means of the cooling water. Aluminum has high affinity with iron and copper. Therefore, when an aluminum molten metal is used for casting the plate 30 having the pipe 20 inside, the second plating layer 24 being copper plating, which is melted in the molten metal, facilitates coupling of the plate 30 and the first plating layer 23 being iron plating, by being placed therebetween.

At the time of casting, when it is necessary to electronically remove a space (mold cavity) occurring in the plate 30, pure aluminum may be adopted since the space is relatively unlikely to occur.

The first plating layer 23 and the second plating layer 24 may have any thickness without particular limitation, provided that sufficient cooling performance of the cooling water flowing through the copper pipe 22 can be exploited, and the copper pipe 22 is not damaged by the molten metal of the plate 30. An inside diameter and a thickness of copper pipe 22 are not limited in particular.

The plate 30 may have any thickness without particular limitation provided that the thickness is greater than an outside diameter of the pipe 20, and sufficient cooling performance of the cooling water can be exploited. The plate 30 may be formed to have a predetermined thickness and then may be formed by cutting down to a desired thickness.

A flow of a manufacturing method of a plate-shaped cooling structure 10 is described next with reference to FIG. 5. FIG. 5 is a flowchart illustrating one example of the flow of the manufacturing method of the cooling structure 10 according to the present example embodiment. In FIG. 5, the copper pipe 22 is assumed to be formed along the heat-generating element 34.

First, the outer surface of the copper pipe 22 is plated with the first plating layer 23 (step S1). Next, the outside of the first plating layer 23 is plated with the second plating layer 24 (step S2). In such a state that the pipe 20 being the copper pipe 22 plated with the first plating layer 23 and the second plating layer 24 is arranged so as to be cast inside the plate 30, the plate 30 is then formed by casting (step S3).

In this way, the cooling structure 10 having the plate 30 that is cast while having the pipe 20 inside may be manufactured.

The cooling structure 10 according to the present example embodiment may increase a level of freedom in the shape of the cooling water flow passageway without increasing a size of the cooling structure, while cooling performance of the cooling structure 10 can be exploited.

For example, a cooling structure may be formed by pouring a molten metal into a casting mold in which a metal pipe made of copper or the like is provided. In this case, as described above, the larger the size of the cooling structure is, the longer it takes for a molten metal temperature in the casting mold to decrease, and the metal pipe is exposed in a high-temperature molten metal for a long period of time. By way of example, a cooling structure having a size of approximately 100 mm×100 mm may have a metal pipe cast inside in a state having a function of the metal pipe. On the other hand, a cooling structure having a size larger than that may cause deformation or melting of the metal pipe during casting, which may possibly result in an insufficient flow of cooling water.

According to the cooling structure 10 of the present example embodiment, the pipe 20 is formed by plating the front surface of the copper pipe 22 with the first plating layer 23 being made of the heat resistant material. Because of this, the pipe 20 does not melt in the molten metal. Also according to the cooling structure 10 of the present example embodiment, formed on the front surface of the first plating layer 23 is the second layer (the second plating layer 24), which is formed from the material having high affinity with the material of the first plating layer 23 and the material of the plate 30. Accordingly, the pipe 20 and the plate 30 that is cast while having the pipe 20 inside are easily coupled. This allows the cooling water flowing through the pipe 20 to sufficiently cool down the heat-generating element 34 mounted on the cooling structure 10, according to the cooling structure 10 of the present example embodiment. As a result, sufficient cooling performance of the cooling structure 10 can be exploited.

For this reason, the cooling structure 10 according to the present example embodiment may be also suitably applied to a device having a large size of the cooling structure 10, such as the transmitter 50. The cooling structure 10 according to the present example embodiment may be any type of equipment provided that the cooling structure 10 is mounted on the power amplifier 40 to be used while being stored in a rack. For example, the cooling structure 10 according to the present example embodiment may be also applied to a cooling server or the like for cooling down drinking water.

As described above, using the method for providing a cooling water flow passageway by means of drilling reduces a level of freedom in a shape of the cooling water flow passageway. When a plurality of linear flow passageways are coupled together with each other, a coupling member needs to be provided, which increases a size of a cooling structure.

On the other hand, the cooling structure 10 according to the present example embodiment is formed by casting the plate 30 while having the pipe 20 inside, the pipe 20 having the flow passageway formed therein. Therefore, before the casting, the pipe 20 can be freely changed. Furthermore, because there is no need to couple the flow passageways together, the cooling structure 10 can be formed without an increase in size of the cooling structure and with keeping cost for forming a flow passageway low.

Coupling a plurality of linear flow passageways together may possibly cause large pressure loss on a coupling portion. Such pressure loss can be reduced in the cooling structure 10 according to the present example embodiment because flow passageways are not coupled together.

The cooling structure 10 according to the present example embodiment enables cooling water with little pressure loss to flow through the flow passageway. Therefore, cooling performance can be improved in this case compared to a case in which a plurality of linear flow passageways are coupled together. With the improved cooling performance, the cooling structure 10 may have the heat-generating element 34 mounted on both planes (the first plane 32 and the second plane 33) of the plate 30, as illustrated in FIG. 4. Even when the heat-generating element 34 is mounted on both planes of the plate 30, the cooling structure 10 may sufficiently cool down the heat-generating element 34.

The example embodiment described above is a suitable example embodiment of the present disclosure, and is not intended to be limiting the scope of the present disclosure only to the above-described example embodiment. Those skilled in the art may modify or substitute the above-described example embodiment and construct an embodiment with different modifications in the scope not departing from the gist of the present disclosure.

REFERENCE SIGNS LIST

10 Cooling structure
20 Pipe
22 Copper pipe
23 First plating layer
24 Second plating layer
30 Plate
40 Power amplifier
50 Transmitter

The invention claimed is:

1. A cooling structure, comprising:
a pipe that has a base material in which a cooling water flow passageway is formed, a first layer formed on an outer surface of the base material, and a second layer formed outside the first layer; and
a plate having the pipe cast in the plate, wherein
the base material is made of a first material being highly thermally conductive,
the first layer is made of a second material having a heat resistance,
the second layer is made of a third material having high affinity with the second material,
the plate is made of a fourth material being highly thermally conductive, and
each of the second material and the third material has high affinity with the fourth material,
wherein an area is provided between the second layer and the plate, in which a part of the third material is mixed with the fourth material.

2. The cooling structure according to claim 1, wherein the plate is mounted with a heat-generating element on at least one surface of the plate, and
the plate has the pipe cast in the plate, the pipe being formed along the heat-generating element.

3. The cooling structure according to claim 1, wherein the fourth material is aluminum or aluminum alloy.

4. The cooling structure according to claim 1, wherein the first material is copper.

5. The cooling structure according to claim 1, wherein the first layer is iron plating.

6. The cooling structure according to claim 1, wherein the second layer is copper plating.

7. A power amplifier, comprising
the cooling structure according to claim 1.

8. A transmitter, comprising
the power amplifier according to claim 7.

9. A cooling structure manufacturing method that is a method of manufacturing a plate-shaped cooling structure, comprising:
forming a first layer on an outer surface of a base material, the first layer being made of a second material having a heat resistance, the base material being made of a first material being highly thermally conductive, and being pipe-shaped through which a cooling water flow passageway is formed;
forming a second layer outside the first layer, the second layer being made of a third material having high affinity with the second material; and
having the base material cast by using a molten metal of a fourth material being highly thermally conductive and having high affinity with the second material and the third material, the base material having the first layer and the second layer formed thereon and making a region in which a part of the third material is mixed with the fourth material formed between the second layer and the plate.

* * * * *